United States Patent
Zarubinsky et al.

(10) Patent No.: US 6,671,336 B1
(45) Date of Patent: Dec. 30, 2003

(54) GAIN CONTROLLER FOR CIRCUIT HAVING IN-PHASE AND QUADRATURE CHANNELS, AND METHOD

(75) Inventors: Michael Zarubinsky, Jerusalem (IL); Ronen Paz, Hadera (IL); Vladimir Koifman, Rishon le-Zion (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/572,558

(22) Filed: May 16, 2000

(51) Int. Cl.$^7$ ............................................. H04L 27/08
(52) U.S. Cl. ..................................... 375/345; 455/246.1
(58) Field of Search ........................... 455/232.1, 234.1, 455/234.2, 235.1, 245.1, 246.1, 247.1; 375/317, 345

(56) References Cited

U.S. PATENT DOCUMENTS

| | | | |
|---|---|---|---|
| 4,633,315 A | 12/1986 | Kasperkovitz | 358/188 |
| 4,799,212 A | 1/1989 | Mehrgardt | 370/20 |
| 4,926,443 A | 5/1990 | Reich | 375/102 |
| 5,095,533 A | 3/1992 | Loper et al. | 455/245 |
| 5,095,536 A | 3/1992 | Loper | 455/324 |
| 5,179,730 A | 1/1993 | Loper | 455/266 |
| 5,230,099 A | 7/1993 | Loper | 455/324 |
| 5,249,203 A | 9/1993 | Loper | 375/97 |
| 5,604,929 A | 2/1997 | Loper et al. | 455/324 |
| 5,930,286 A | 7/1999 | Walley | 375/200 |
| 6,044,112 A | * 3/2000 | Koslov | 375/235 |
| 6,317,589 B1 | * 11/2001 | Nash | 455/245.2 |
| 6,484,042 B1 | * 11/2002 | Loke | 455/550.1 |

OTHER PUBLICATIONS

"Interpolation and Decimation of Digital Signals—A Tutorial Review" by Crochiere, R. E. and Rabiner, L. R., Proceedings of the IEEE, vol. 69, No. 3, Mar. 1981.

"Multirate Digital Signal Processing" excerpt of "Digital Signal Processing", Third Edition, Prentice Hall, Upper Saddle River, 1996 by Proakis, J. G. and Manolakis, D. G., ISBN: 0–13–373762–4, sections 10.1 to 10.6 of chapter 10.

"Compensation of frequency dependent quadrature imbalance in a zero–if downconverter" by J. Michels and S. Jasper, excerpt of Motorola Technical Developments, vol. 38, Jun. 1999, pp. 183–186.

* cited by examiner

Primary Examiner—Stephen Chin
Assistant Examiner—Kevin Kim (57) ABSTRACT

In a radio circuit (299) that forwards a signal pair (I,Q) by a first channel (291, I) and by a second channel (292, Q), a gain controller (200) monitors differences between the overall gains ($G_I$, $G_Q$) in the channels and corrects a gain imbalance by feeding back a gain determining control signal (W) to one of the channels. The controller has first (221–224) and second (211–214) pluralities of single-bit comparators, operating at a high sampling rate, to monitor the signal pair at the channel inputs (281, 282) and at the channel outputs (283, 284), respectively, and to provide difference signals ($\Delta X, \Delta Y$) to an integrator (280) that calculates the gain control signal (W) at a decimated sampling rate ($F_R$).

19 Claims, 4 Drawing Sheets

GAIN CONTROLLER FOR CIRCUIT HAVING IN-PHASE AND QUADRATURE CHANNELS, AND METHOD

FIELD OF THE INVENTION

The present invention generally relates to electronic circuits having in-phase and quadrature channels, and more particularly, to a gain controller for such circuits and to a method.

BACKGROUND OF THE INVENTION

Receiver circuits and transmitter circuits (collectively "radio circuits") of the direct conversion type are often used for radio frequency (RF) filtering in communication devices such as mobile phones, television receivers or the like.

Such a radio circuit uses signal pairs having an in-phase signal (I) and a quadrature signal (Q). Both signals I and Q have a substantially equal carrier frequency. The Q signal is 90° phase shifted to the I signal. In other words, both signals are in quadrature to each other.

The radio circuit has a first channel for the I signal and second channel for Q signal. Each channel independently forwards and processes its signal, for example by digital-to-analog converting and low-pass filtering. Other signal processing is also possible, for example, analog-to-digital converting. Exact processing of the I and Q signals require, among other things, that both signals have the same amplitude.

However, differences in the gains (amplitude transfer function) of the channels commonly occur as a result of changes in temperature, frequency, manufacturing variations of the electrical components and other parameters. Small gain differences, ("mismatch") can result in distortions in further circuitry coupled to the radio circuit.

Useful references can be found in U.S. Pat. Nos. 5,604,929; 5,249,203; 5,230,099; 5,179,730; 5,095,536; 5,095,533; all to Looper; as well as in U.S. Pat. No. 4,926,443 to Reich; U.S. Pat. No. 4,633,315 to Kasperkovitz; U.S. Pat. No. 5,930,286 to Walley; and U.S. Pat. No. 4,799,212 to Mehrgardt.

The present invention seeks to provide an improved gain controller and a method, which mitigate or avoid disadvantages and limitations of the prior art.

DETAILED DESCRIPTION OF THE PREFERRED EMBODIMENT

For convenience, a glossary of terms used here and their definition is provided prior to the claims.

The following explanation uses abbreviations such as "A" for "analog", "D" for "digital"; "P" for "plus"; "M" for "minus"; and the ellipsis " . . . " collectively for either P or N. Arrows in signal lines of the block diagrams illustrate a preferred signal flow.

Figure 1:
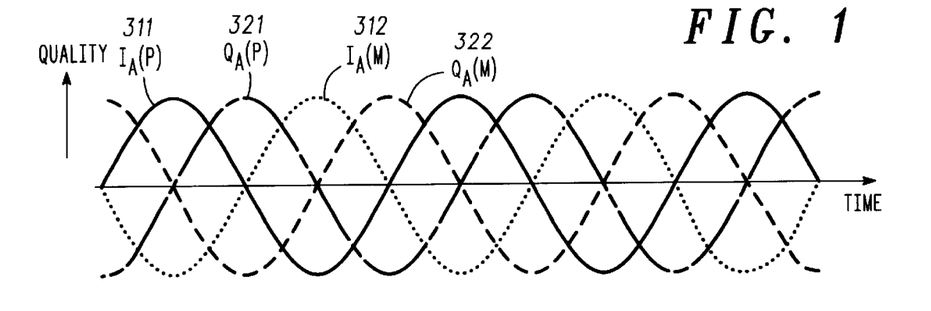
FIG. 1 illustrates a simplified time diagram of a signal pair with an in-phase signal and a quadrature signal.

FIG. 1 illustrates a simplified time diagram of the signal pair I,Q with the in-phase signal I (traces 311, 312) and—shifted by substantially 90°—the quadrature signal Q (traces 321, 322). The horizontal axis shows the time t, and the vertical axis shows a physical quantity of the signals, such as voltage, current or the like.

FIG. 1 shows the signals conveniently as analog signals (index "A"); digital signals (index "D") can be defined similarly.

Signals $I_A$ and $Q_A$ each are differential signals each with a first component (traces 311, 321) and a second component (dashed traces 312, 322). For convenience of further explanation, first and second components are referred to as "plus" (P) and "minus" (M) components: component $I_A(P)$ by trace 311, component $I_A(M)$ by trace 312, component $Q_A(P)$ by trace 321, and component $Q_A(M)$ by trace 322.

In the following discussion, common quantity offsets in the P and M components of each signal are neglected so that for each signal, both the P and N components are symmetric to the time axis. The sine shape of the signals is only intended to be a non-limiting example; any other shapes are possible.

Figure 2:
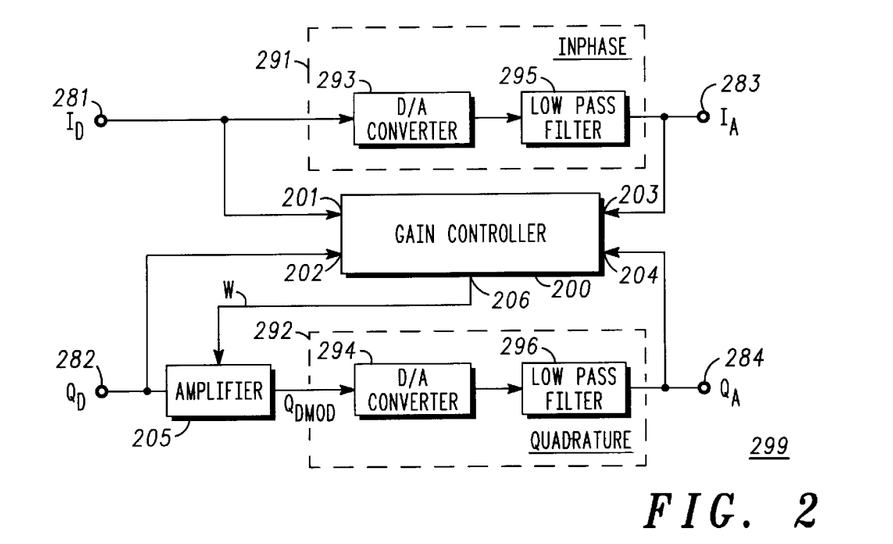
FIG. 2 illustrates a simplified block diagram of a circuit having in-phase and quadrature channels that is controlled by a gain controller according to the present invention.

FIG. 2 illustrates a simplified block diagram of radio circuit 299 having an in-phase channel 291 (dashed frame) and an quadrature channel 292 (dashed frame) that is controlled by gain controller 200 according to the present invention.

Explaining the present invention for two channels 291, 292 is convenient, but not necessary for the present invention. Persons of skill in the art are able, based on the description herein, to implement controller 200 also for applications with further channels without departing from the scope of the present invention.

The term "in-phase" is therefore intended to be only a convenient abbreviation for signals and elements (like channel, input, output, etc.) in a "first" channel; and the term "quadrature" is an abbreviation for signals and elements in a "second" channel.

Gain controller 200 can be used in a variety of telecommunication and other applications, for example, cellular phones operating according to international standards, such as for example CDMA (Code Division Multiple Access) and others. Gain controller 200 according to the present invention is therefore conveniently explained with the assumption that circuit 299 belongs to a radio receiver.

By in-phase channel 291, circuit 299 forwards an in-phase input signal (e.g., signal $I_D$) to in-phase output signal (signal $I_A$). By quadrature channel 292, circuit 299 forwards a quadrature input signal (e.g., signal $Q_D$) to quadrature output signal (e.g., signal $Q_A$). As illustrated, input signals are digital signals; and output signals are analog signals. This is convenient, but not essential. Persons of skill in the art can modify circuit 299 (analog input, digital output, both analog, both digital).

In circuit 299, in-phase channel 291 comprises digital-to-analog converter (DAC) 293 and low-pass filter (LPF) 295 to convert digital in-phase signal ID present at digital in-phase input 281 to analog in-phase signal $I_A$ at analog in-phase output 283. Quadrature channel 292 comprises DAC 294 and LPF 296 to convert digital quadrature signal $Q_D$ present at digital quadrature input 282 to analog quadrature signal $Q_A$ at analog quadrature output 284.

The overall gains $G_I = I_A/I_D$ and $G_Q = Q_A/Q_D$ in both channels 291 and 292, respectively, should substantially be equal. Gain controller 200 has input 201 coupled to input 281 to receive digital in-phase signal $I_D$; input 202 coupled to input 282 to receive digital quadrature signal $Q_D$; input 203 coupled to output 283 to receive analog in-phase signal $I_A$; and input 204 coupled to output 284 to receive analog quadrature signal $Q_A$.

Preferably, digital signals $I_D$ and $Q_D$ are represented by multiple bits. During processing, optional quantizers (details later) can reduce the number of bits, for example to one ("single-bit").

In a feedback arrangement, gain controller 200 obtains gain control signal W (available at output 206). Preferably, signal W controls gain amplifier 205 that is coupled between digital quadrature input 282 and DAC 294. Multiplier controls the quantity of signal $Q_D$ that goes into DAC 294. The amplitude of signal $Q_D$ (before amplifier 205) is related to the amplitude of modified signal $Q_{D\ MOD}$ (after amplifier 205) by gain L ($L = Q_{D\ MOD}/Q_D$). In such a way, relative differences ($G_I/G_Q$) and absolute differences ($G_I - G_Q$) between overall gains $G_I$ and $G_Q$ are avoided.

Having amplifier 205 associated with quadrature channel 292 is convenient for explanation but not necessary for the present invention. Those of skill in the art are able, based on the description herein, to couple amplifier 205 also to in-phase channel 291 without departing from the scope of the present invention.

Before explaining details of gain controller 200, sampling rates of digital signals are discussed.

Figure 3:
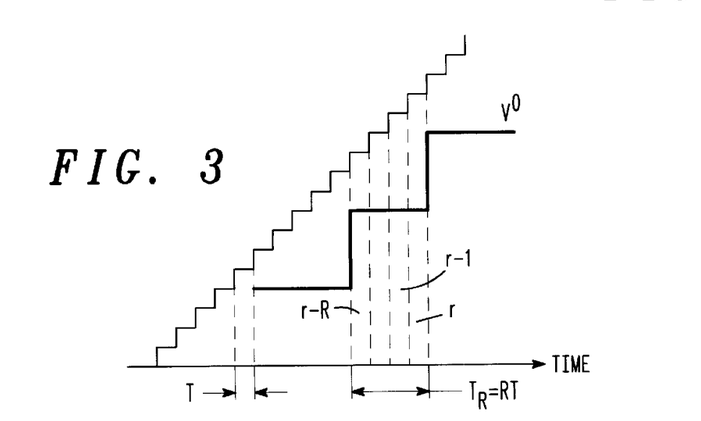
FIG. 3 illustrates a simplified time diagram of digital signals having first and second sampling rates.

FIG. 3 illustrates a simplified time diagram of digital signal $V_D$ having a first sampling rate and digital signal V° having a second sampling rate.

Digital signal $V_D$ has substantially constant magnitudes during first time intervals T (hereinafter "time slots") . In other words, signal $V_D$ is sampled at first sampling rate F=1/T. Digital signal $V_D$ stands for digital signals like $I_D$ and $Q_D$ (FIG. 2) and $X_D$, $Y_D$, $X_A$, $Y_A$, ΔX, ΔY (cf. FIG. 5). When writing $V_D(r)$, time slots T are conveniently identified by indices r, r–1, r–2, . . . r–R.

Sampling rate F depends on the application of I and Q signals in circuit 299. For example, for a radio receiver employing baseband frequencies (cf. $T_{SIG}$ in FIG. 7) of about zero to 600 kHz, rate F=5 MHz is an oversampling rate. Preferably, the oversampling ratio is between 4 and 16 of twice the baseband frequency.

Internally, gain controller 200 also uses signals V° that have substantially constant magnitudes during second, longer time intervals $T_R = R*T$ (hereinafter "time frames"). In other words, such signals are sampled with the predetermined second, lower sampling rate $F_R = 1/T_R = F/R$. R is a sampling rate decimation ratio. Preferably, R is an integer, but real ratios can also be used. In other words, R indicates the number of time slots per time frame. Useful values for R are in the range between $R_{MIN} = 8$ and $R_{MAX} = 64$. Preferably, R is in the range between $R_{MIN} = 16$ and $R_{MAX} = 32$.

For any time frame $T_R = R*T$ ending with a time slot identified by index r, an average $V_{AVERAGE}$ of $V_D(r)$, can be defined, for example, as follows:

$$V_{AVERAGE} = \frac{1}{R} * \sum_{j=0}^{R-1} V(r-j) \quad (1)$$

Figure 5:
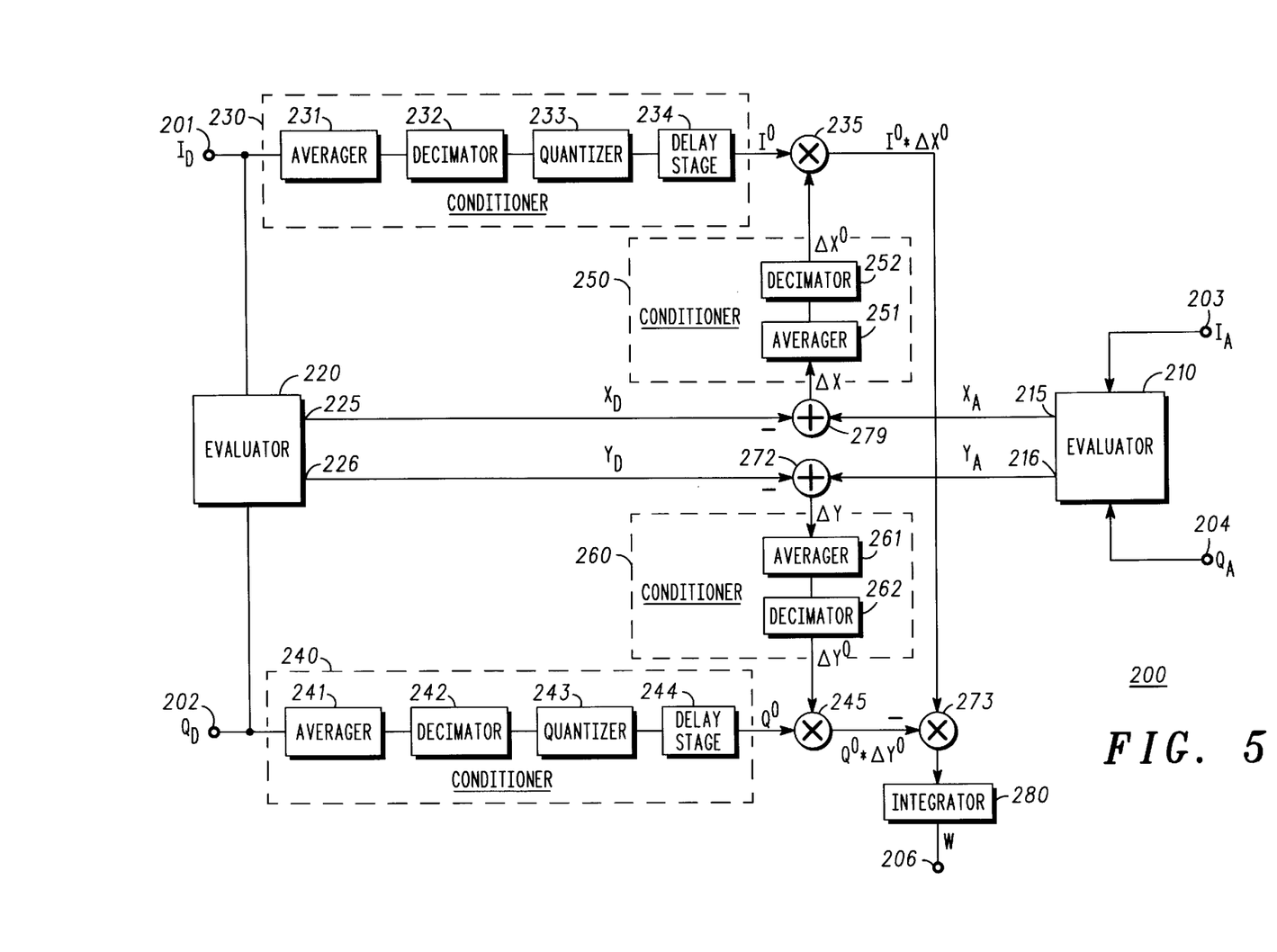
FIG. 5 illustrates a simplified block diagram of the gain controller of FIG. 2 with more detail.

Controller 200 internally uses rate decimation where signals $V_D$ are converted to signals V° (e.g., ΔX°, ΔY°, I°, Q°, cf. FIG. 5).

For the application of sampling rate decimators, the following references are useful: Crochiere, R. E. and Rabiner, L. R.: "Interpolation and Decimation of Digital Signals—A Tutorial Review", Proceedings of the IEEE, vol. 69, No. 3, March 1981; and Proakis, J. G., Manolakis, D. G.: "Digital Signal Processing", Third Edition, Prentice Hall, Upper Saddle River, 1996, ISBN 0-13-373762-4, sections 10.1 to 10.6 of chapter 10 "Multirate Digital Signal Processing".

Figure 4:
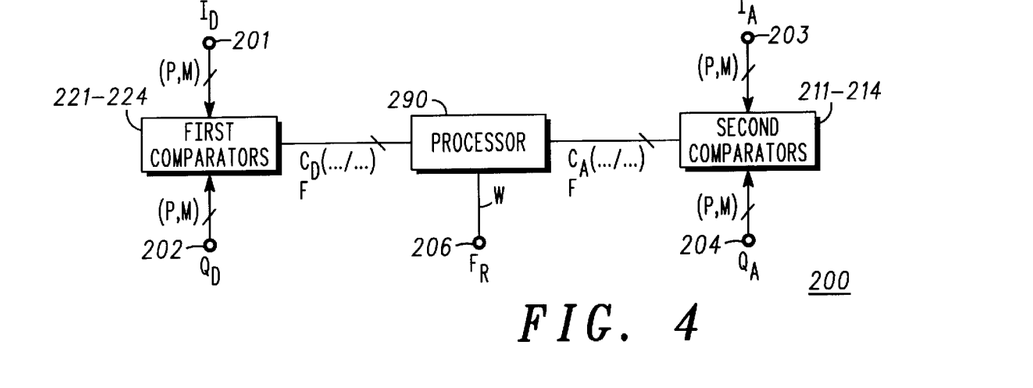
FIG. 4 illustrates a simplified block diagram of the gain controller of FIG. 2.

FIG. 4 illustrates a simplified block diagram of gain controller 200 according to the present invention. Gain controller 200 provides control signal W at output 206 that (by varying L) adjusts the overall gain in either ("first") in-phase channel 291 or ("second") quadrature channel 292 of circuit 299 (cf. FIG. 5). Gain controller 200 comprises a first plurality of comparators 221–224 (details FIG. 8), a second plurality of comparators 211–214 (details FIG. 6), and signal processing circuit 290.

In the first plurality of comparators, each comparator 221, 222, 223, 224 compares one of first (e.g., $I_D(P)$) and second (e.g., $I_D(M)$) components of the in-phase input signal (e.g., $I_D$ at input 201) to one of first (e.g., $Q_D(P)$) and second (e.g., $Q_D(M)$) components of the quadrature input signal (e.g., $Q_D$ at input 202). Each comparator 221, 222, 223, 224 provides a single-bit "input related" intermediate signal (e.g., $C_D(\ldots,\ldots)$) at the first sampling rate F.

In the second plurality of comparators, each comparator 211, 212, 213, 214 compares one of first (e.g., $I_A(P)$) and second (e.g., $I_A(M)$) components of the in-phase output signal (e.g., $I_A$ at input 203) to one of first (e.g., $Q_A(P)$) and second (e.g., $Q_A(M)$) components of the quadrature output signal (e.g., $Q_A$ at output 204). Each comparator 211, 212, 213, 214 provides a single-bit "output related" intermediate signal ($C_A(\ldots,\ldots)$) at first sampling rate F.

Signal processing circuit 290 receives the "input related" single-bit intermediate signal (e.g., $C_D(\ldots,\ldots)$) from each of comparators 221, 222, 223, 224 (first plurality) and receives the "output related" single-bit intermediate signal (e.g., $C_A(\ldots,\ldots)$) from each of comparators 211, 212, 213, 214 (second plurality) and integrates a predetermined combination of the single-bit intermediate signals (example explained later) to control signal W (output 206) at the second, lower sampling rate $F_R$.

Using comparators that output single-bit signals is an important advantage of the present invention and avoids the use of precise multibit converters.

In connection with the following figures, signal processing circuit 290 is explained with dedicated hardware elements such as, for example, combiners 217, 218, 227, 228, (in evaluators 210, 220), conditioners 230, 240, 250, 260, adders 271, 272, 273, multipliers 235, 245, and integrator 280. This is convenient for explanation, but not limited thereto. Persons of skill in the art are able, based on the description herein, to implement the function of processing circuit 290 by a digital signal processor (DSP) or other general purpose processor such as a microprocessor, without departing from the scope of the present invention.

FIG. 5 illustrates a simplified block diagram of gain controller 200. Gain controller 200 comprises signal evaluator 210 (details in FIGS. 6–7), signal evaluator 220 (details in FIG. 8), signal conditioners 230, 240, 250, 260 (dashed frames), adders 271, 272, 273, multipliers 235, 245, and integrator 280.

Signal conditioner 230 comprises averager 231 (symbol Σ), decimator 232 (symbol ↓), quantizer 233, and delay stage 234. Signal conditioner 240 comprises averager 241, decimator 242, quantizer 243, and delay stage 244. Signal conditioner 250 comprises averager 251 and decimator 252. Signal conditioner 260 comprises averager 261 and decimator 262.

Signal conditioner 230 receives digital in-phase signal $I_D$ having the sampling rate F at input 201 and provides conditioned in-phase signal I° having the lower sampling rate $F_R$ (at output of stage 234). Similarly, conditioner 240 receives digital quadrature signal $Q_D$ (sampling rate F, input 202) and provides conditioned quadrature signal Q° (sampling rate $F_R$, output of stage 244). Signal conditioners 250 and 260 condition difference signals ΔX (from adder 271, see below) and ΔY (from adder 272) to signals ΔX° and ΔY°, respectively, by converting to rate $F_R$. In other words, signals ΔX° and ΔY° are $F_R$ rate representations of difference signals ΔX° and ΔY°, respectively.

For conditioning, the conditioners use averagers 231, 241, 251, 261 to provide averages (cf. equation (1)) and decimators 232, 242, 252, 262 to decimate from rate F to rate $F_R$, and—optionally—quantizers 233, 243 to convert multi-bit signals, preferably, to single-bit signals; and delay stages 234, 244 for synchronization purposes.

Signal evaluator 210 receives analog in-phase signal $I_A$ and analog quadrature signal $Q_A$ (at inputs 203, 204, respectively) and provides combination signals $X_A$ and $Y_A$ (at outputs 215, 216, respectively). Similarly, signal evaluator 220 receives digital in-phase signal $I_D$ and digital quadrature signal $Q_D$ (at inputs 201, 201, respectively) and provides combination signals $X_D$ and $Y_D$ (at outputs 225, 226, respectively). Preferably, signals $X_A$, $Y_A$, $X_D$ and $Y_D$ are at sampling rate F. Details on how signals $X_A$, $Y_A$, $X_D$ and $Y_D$ are obtained are explained in connection with FIGS. 6–8.

Adder 271 provides difference signal ΔX by subtracting signal $X_D$ from signal $X_A$; adder 272 provides difference signal ΔY by subtracting signal $Y_D$ from signal $Y_A$ (cf. the minus symbols). Preferably, signals ΔX and ΔY keep sampling rate F.

Multiplier 235 receiving I° and ΔX° forwards the intermediate product I°*ΔX° to adder 273; similarly, multiplier 245 receiving Q° and ΔY° forwards the intermediate product Q°*ΔY° to adder 273. Adder 273 forwards the difference I°*ΔX°−Q°*ΔY° to integrator 280. Integrator 280 provides above mentioned gain control signal W at output 206 (cf. FIG. 2). Signal W controls amplifier 205 (cf. FIG. 2) such that quadrature signal $Q_D$ at input 282 (cf. FIG. 2) is forwarded to DAC 294 as $Q_{D\ MOD}$ with the gain L=1+W. Thereby, the feedback control loop from outputs 282, 284 to channels 291, 292 is formed. Details about signal W are explained later.

Figure 6:
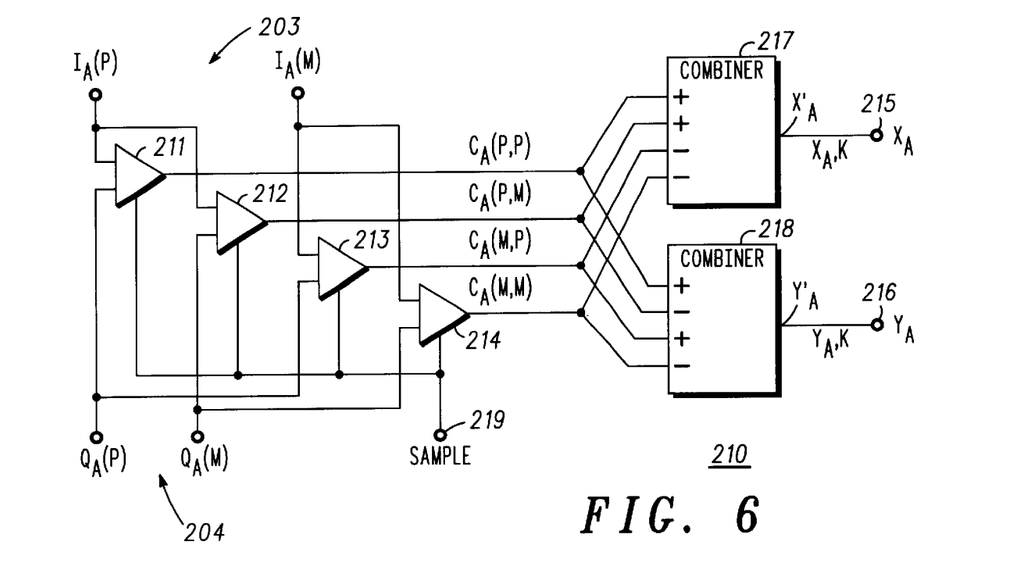
FIG. 6 illustrates a simplified block diagram of a signal evaluator in the gain controller of FIG. 5.

FIG. 6 illustrates a simplified block diagram of signal evaluator 210 in gain controller 200 (cf. FIG. 5). Signal evaluator 210 comprises analog comparators 211, 212, 213, and 214 and combiners 217 and 218.

Each of comparators 211, 212, 213, 214 has a first input to receive a component $I_A(\ldots)$ from input 203 (cf. FIGS. 1,2,4,5), a second input to receive a component $Q_A(\ldots)$ from input 204 (cf. FIGS. 1,2,4,5), and an output to provide the above mentioned single-bit intermediate signal $C_A(\ldots,\ldots)$. $C_A(\ldots,\ldots)$ is "output related" because it is derived from outputs 283 and 284 of circuit 299.

Combiners 217 and 218 receive signals $C_A(\ldots,\ldots)$ and send above mentioned signals $X_A$ and $Y_A$ to output 215 and 216, respectively.

Preferably, comparators 211, 212, 213, and 214 receive sample signal SAMPLE at rate F from input 219 to output an updated intermediate signal $C_A(\ldots,\ldots)$ once in each time slot T.

Preferably, each analog comparator 211, 212, 213, and 214 is a single-bit analog-to-digital converter. In other words, intermediate signal $C(\ldots,\ldots)$ can assume only two magnitudes, for example, "+1" and "−1", indicating a first and a second logical state, respectively.

In an ideal case, each comparator outputs signal $C_A(\ldots,\ldots)$ in the first state when component $I_A(\ldots)$ is larger than or equal to component $Q_A(\ldots)$; and outputs signal $C_A(\ldots,\ldots)$ is the second state when component $I_A(\ldots)$ is smaller than component $Q_A(\ldots)$, that is $$C_A(\ldots,\ldots)\text{="+1" for }I_A(\ldots)-Q_A(\ldots)\geq 0 \qquad (2)$$

$$C_A(\ldots,\ldots)\text{="−1" for }I_A(\ldots)-Q_A(\ldots)<0 \qquad (4)$$

However, in the non-ideal case, this statements are extended by introducing comparator offsets $O_A(\ldots,\ldots)$, for example:

$$C_A(\ldots,\ldots)\text{="+1" for }I_A(\ldots)-Q_A(\ldots)\geq O_A(\ldots,\ldots)$$

$$C_A(\ldots,\ldots)\text{="−1" for }I_A(\ldots)-Q_A(\ldots)<O_A(\ldots,\ldots) \quad (6,8)$$

Offsets $O_A(P,P)$, $O_A(P,M)$, $O_A(M,P)$, and $O_A(M,M)$ may be different for each comparator 211, 212, 213, and 214, respectively, and can assume positive and negative values.

The comparators receive the components and provide the output related single-bit signals as follows: Comparator 211 receives components $I_A(P)$ and $Q_A(P)$ and provides signal $C_A(P,P)$; comparator 212 receives components $I_A(P)$ and $Q_A(M)$ and provides signal $C_A(P,M)$; comparator 213 receives components $I_A(M)$ and $Q_A(P)$ and provides signal $C_A(M,P)$; comparator 214 receives components $I_A(M)$ and $Q_A(M)$ and provides signal $C_A(M,M)$. The function of combiners 217 and 218 will be explained later.

Figure 7:
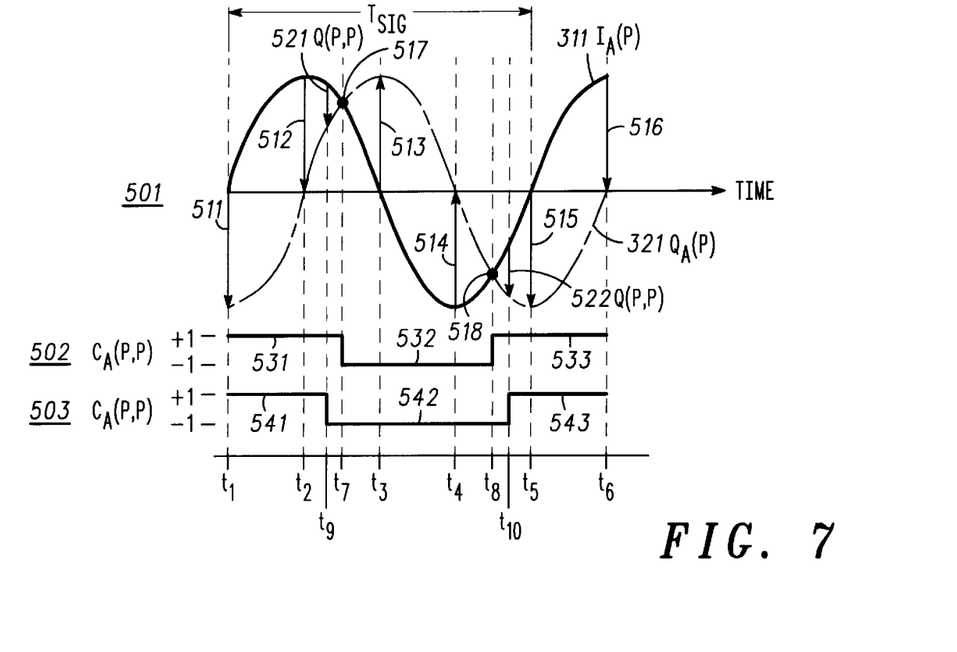
FIG. 7 illustrates, in combination, simplified time diagrams of signal component supplied to an analog comparator in the signal evaluator of FIG. 6 and of an intermediate signal provided by the analog comparator in an ideal case and as distorted by an offset.

FIG. 7 illustrates, in combination,
 simplified time diagram 501 of a signal component (e.g., $I_A(P)$, bold, trace 311 as in FIG. 1) of in-phase signal I and of a signal component (e.g., $Q_A(P)$, trace 321 as in FIG. 1) of quadrature signal Q that are supplied to an analog comparator (e.g., to 211) in signal evaluator 210 (cf. FIG. 6),
 simplified time diagram 502 of the intermediate single-bit signal (e.g., $C_A(P,P)$) provided by the analog comparator (e.g., by comparator 211) in an ideal case, and
 simplified time diagram 503 of that intermediate signal single-bit distorted by the comparator offset (e.g. O(P, P)).

Similar as in FIG. 1, the sine form is only an example. Diagrams 501, 502 and 503 have a common horizontal time axis t with consecutive time points $t_1$ to $t_6$ as well as time points $t_7$ to $t_{10}$. The time points are useful for explanation and must not necessarily be synchronous to time slots T (cf. FIG. 3). Since comparator 211 provides signal $C_A(P,P)$ at rate F that is an oversampling rate in respect to the signal period length $T_{SIG}$ (e.g., $T_{SIG}=t_5-t_1$), the generation of signal $C_A(P,P)$ is expected at any time point.

As in diagram 501, component $I_A(P)$ starts with zero quantity at $t_1$, reaches a positive maximum at $t_2$, again reaches zero at $t_3$, reaches a negative maximum at $t_4$, again reaches zero at $t_5$, and reaches the positive maximum at $t_6$. Component $Q_A(P)$ (that is 90° shifted) has the negative maximum at $t_1$, reaches zero at $t_2$, reaches the positive maximum at $t_3$, reaches zero at $t_4$, reaches the negative maximum at $t_5$, and reaches zero at $t_6$. The period length $T_{SIG}$ is unchanged. Vertical arrows going from $I_A(P)$ to $Q_A(P)$ indicate the difference $I_A(P)-Q_A(P)$ (cf. statements (2) (4) (6) (8)).

Diagram 501 in combination with diagram 502 illustrates an ideal operation of comparator 211 without offset (cf. statements (2) (4)). Down-pointing arrows 511, 512, 515 and 516 at $t_1$, $t_2$, $t_5$, and $t_6$, respectively, stand for signal $C_A(P,P)$ that is "+1". Similarly, for up-pointing arrows 513 and 514 at $t_3$ and $t_4$, respectively, signal $C_A(P,P)$ is "−1". For time points $t_7$ and $t_8$ where the quantities of both components $I_A(P)$ and $Q_A(P)$ are substantially equal, the arrows are reduced to points 517 and 518, respectively, and signal $C_A(P,P)$ is defined as "+1" (cf. (6), diagram 502). Hence, signal $C_A(P,P)$ is "+1" before $t_7$ (trace 531) and after $t_8$ (trace 533) and "−1" in the meantime (trace 532). A signal changing rate is $t_8-t_7=T_{SIG}/2$.

Diagram 501 in combination with diagram 503 illustrates the operation of comparator 211 with offset O(P,P). Down-pointing arrow 521 at $t_9$ represents the offset O(P,P); signal $C_A(P,P)$ goes to "−1" at $t_9$ earlier than in the ideal case (traces 541, 542). Up-pointing arrow 522 at $t_{10}$ again represents the offset O(P,P); signal $C_A(P,P)$ returns to "−1" at $t_{10}$ later than in the ideal case (traces 542, 543). Hence, the signal changing rate of $C_A(P,P)$ becomes asymmetric ($t_{10}-t_9>T_{SIG}/2$).

The offset O(P,P) is also represented by the different length of the "+1" and "−1" intervals of $C_A(P,P)$. As a person of skill in the art will understand without the need of further illustration, amplitude differences between components $I_A(P,P)$ and $Q_A(P,P)$ will also modify these interval lengths.

Therefore, all the signals $C_A(P,P)$, $C_A(P,M)$, $C_A(M,P)$ and $C_A(M,M)$ of comparators 211, 212, 213 and 214, respectively, of signal evaluator 210 (cf. FIG. 6) carry information about the offsets O(. . . , . . . ) and the amplitude differences between the signal components. It is now explained how this information is further evaluated.

Coming back to FIG. 6, combiner 217 receives signals $C_A(P,P)$, $C_A(P,M)$, $C_A(M,P)$ and $C_A(M,M)$ and provides signal $X'_A$ according to $$X'_A=\{+C_A(P,P)+C_A(P,M)-C_A(M,P)-C_A(M,M)\} \quad (10)$$

Hence, combiner 217 uses a first summation pattern (++−−), that, in the example, means combining the positive of $C_A(P,P)$, the positive of $C_A(P,M)$, the negative of $C_A(M,P)$ and the negative of $C_A(M,M)$.

Taking into account any noise $x_A$ (lowercase) introduced, for example, by the comparators, and a constant scaling factor k, the signal $X_A$ that is available at output 215 is estimated as:

$$X_A=k*X'_A+x_A \quad (12)$$

Combiner 218 also receives signals $C_A(P,P)$, $C_A(P,M)$, $C_A(M,P)$ and $C_A(M,M)$ and provides signal $Y'_A$ according to $$Y'_A=\{+C_A(P,P)-C_A(P,M)+C_A(M,P)-C_A(M,M)\} \quad (14)$$

Hence, combiner 218 uses a second summation pattern (+−+−), that, in the example, means combining the positive of $C_A(P,P)$, the negative of $C_A(P,M)$, the positive $C_A(M,P)$ and the negative of $C_A(M,M)$.

Again taking into account any noise $Y_A$ (lowercase), for example, introduced by the comparators, and the factor k, the signal $Y_A$ that is available at output 216 is estimated as:

$$Y_A=k*Y'_A+Y_A \quad (16)$$

Figure 8:
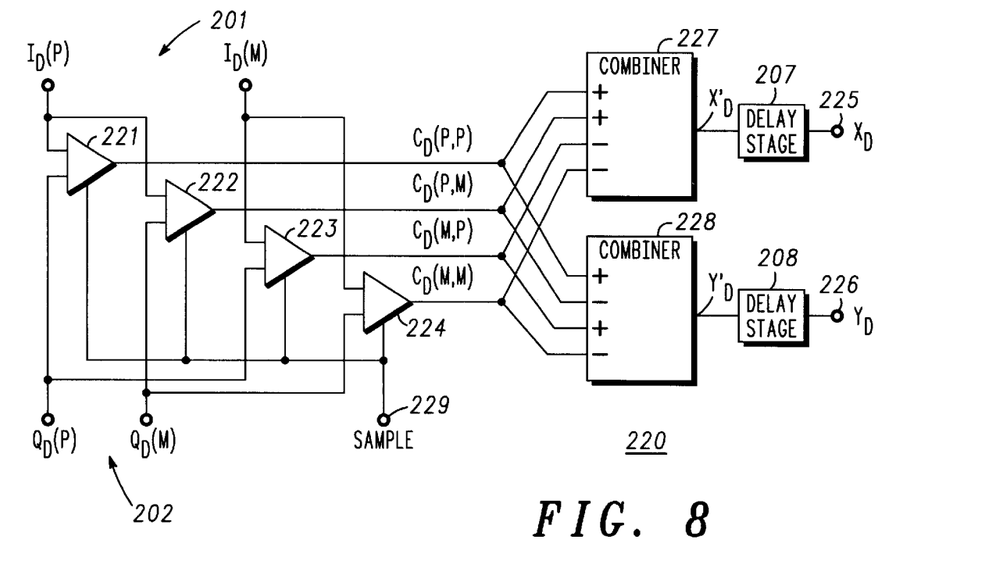
FIG. 8 illustrates a simplified block diagram of a further signal evaluator in the gain controller of FIG. 5.

FIG. 8 illustrates a simplified block diagram of signal evaluator 220 of gain controller 200 (cf. FIG. 5). Signal evaluator 220 comprises digital comparators 221, 222, 223 and 224, combiners 227 and 228, and delay stages 207 and 208. Input signals of evaluator 220 are digital in-phase signal $I_D$ at input 201 and digital quadrature signal $Q_D$ at input 202; and output signals are signals $X_D$ at output 225 and $Y_D$ at output 226. Comparators 221, 222, 223, 224 are clocked by sample signal SAMPLE from input 229. Preferably, SAMPLE is the same as in evaluator 210 (cf. FIG. 6).

For convenience, signals $I_D$ and $Q_D$ are considered as differential signals each with a first component (P) and a second component (M), wherein $$I_D(M)=-I_D(P) \text{ and} \quad (18)$$

$$Q_D(M)=-Q_D(P). \quad (20)$$

The comparators receive the components $I_D(\ldots)$, $Q_D(\ldots)$ and provide single-bit signals $Q_D(\ldots)$. $Q_D(\ldots,\ldots)$ are "input related" because they are derived from inputs 281, 282 of circuit 299.

In detail, comparator 221 receives components $I_D(P)$ and $Q_D(P)$ and provides signal $C_D(P,P)$; comparator 222 receives components $I_D(P)$ and $Q_D(M)$ and provides signal $C_D(P,M)$; comparator 223 receives components $I_D(M)$ and $Q_D(P)$ and provides signal $C_D(M,P)$; comparator 224 receives components $I_D(M)$ and $Q_D(M)$ and provides signal $C_D(M,M)$. Conveniently, the comparators provide the signals $C_D(\ldots,\ldots)$ according to the following definitions:

$$C_D(\ldots,\ldots)="+1" \text{ for } I_A(\ldots)-Q_D(\ldots)\geq 0 \quad (22)$$

$$C_D(\ldots,\ldots)="-1" \text{ for } I_D(\ldots)-Q_D(\ldots)<0 \quad (24)$$

In comparison to analog comparators 211, 212, 213, 214 described above, digital comparators 221, 222, 223, 224 substantially avoid the offset.

Combiner 227 receives signals $C_D(P,P)$, $C_D(P,M)$, $C_D(M,P)$ and $C_D(M,M)$ and provides signal $X'_D$ according to $$X'_D=\{+C_D(P,P)+C_D(P,M)-C_D(M,P)-C_D(M,M)\} \quad (26)$$

Hence, combiner 227 uses the above mentioned first summation pattern.

Delay stage 207 forwards signal $X'_D$ with a delay of N time slots T. The symbol $Z^{-N}$ is an operator of a Z-transformation. Persons of skill in the art can implement delay stage 207 without the need of detailed explanation herein, for example, by a shift register. The delay of stage 207 conveniently corresponds to the intrinsic input-to-output delay introduced in in-phase channel 291 (e.g., by DAC 293, LPF 295). This is convenient. As explained in connection with FIG. 3, the "input related" signal $X_D$ is combined with the delayed "output related" $X_A$.

Taking further into account any noise $X_D$ (lowercase) introduced, for example, by comparators and delay stage 207, and the above mentioned scaling factor k, the signal $X_D$ forwarded to output 225 is estimated as:

$$X_D = k*X'_D*Z^{-N} + X_D \quad (28)$$

Combiner 228 receives signals $C_D(P,P)$, $C_D(P,M)$, $C_D(M,P)$ and $C_D(M,M)$ and provides signal $Y'_D$ according to $$Y'_D = \{+C_D(P,P) - C_D(P,M) + C_D(M,P) - C_D(M,M)\} \quad (30)$$

Hence, combiner 228 uses the above mentioned second summation pattern.

Delay stage 208 forwards signal $Y'_D$ to output 226 with the delay of N time slots T. Taking also into account any noise $y_D$ (lowercase) introduced, for example, by the comparators and by delay stage 208, and the scaling factor k, the signal $Y_D$ forwarded to output 226 is estimated as:

$$Y_D = k*Y'_D*Z^{-N} + y_D \quad (32)$$

N conveniently corresponds to the delay introduced in in-phase channel 292 (e.g., by DAC 294, LPF 296).

Giving the above definitions of $C_D(\ldots,\ldots)$ with possible values "+1" and "−1", signals $X_D$ and $Y_D$ can be any numbers from the set "−4", "−3", "−2", "−1", "0", "+1", "+2", "+3" and "+4".

The explanation now gives more details to FIG. 5. As mentioned above, adder 271 combines signal $X_A$ with the negative of signal $X_D$ to signal $\Delta X$, that is:

$$\Delta X = X_A - X_D \quad (34)$$

$$\Delta X = k*X'_A + x_A - (k*X'_D*Z^{-N} + x_D) \quad (36)$$

Assuming that the noise portions $x_A$ and $x_D$ substantially cancel each other, the last equation is simplified to:

$$\Delta X = k*(X'_A - X'_D*Z^{-N}) \quad (38)$$

$$\Delta X = k*X'_D*Z^{-N}(G_X - 1) \quad (40)$$

wherein gain $G_X$ is defined as $$G_X = \frac{X'_A}{X'_D * Z^{-N}} \quad (42)$$

Similarly, adder 272 combines signal $Y_A$ with the negative of signal $Y_D$ to signal $\Delta Y$, wherein noise portions $y_A$ and $y_D$ cancel, that is:

$$\Delta Y = Y_A - Y_D \quad (44)$$

$$\Delta Y = k*Y'_A + y_A - (k*Y'_D*Z^{-N} + y_D) \quad (46)$$

$$\Delta Y = k*(Y'_A - Y'_D*Z^{-N}) \quad (48)$$

$$\Delta Y = k*X'_D*Z_{-N}(G_Y - 1) \quad (50)$$

$$G_Y = \frac{Y'_A}{Y'_D * Z^{-N}} \quad (gain) \quad (52)$$

As mentioned above, adder 273 forwards the difference $I^{\circ}*\Delta X^{\circ} - Q^{\circ}*\Delta Y^{\circ}$ to gain integrator 280 that provides gain control signal W (cf. FIG. 2) according to:

$$W = \int I^{\circ}*\Delta X^{\circ} - Q^{\circ}*\Delta Y^{\circ} dt \quad (56)$$

$$W = k*Z^{-N} * \int I^{\circ}*X'_D*(G_X - 1) - Q^{\circ}*Y'_D*(G_Y - 1) dt \quad (58)$$

$$W = h*Z^{-N} * \int G_X - G_Y dt \quad (60)$$

where h is a constant, providing, for example, that W becomes dimensionless.

As mentioned above, with gain control signal W supplied to amplifier 205, gain controller 200 provides a feedback loop that relates the gain L of amplifier 205 to W, preferably, according to:

$$L = 1 + W \quad (62)$$

In an ideal case, gains $G_X$ and $G_Y$ are substantially equal so that W substantially becomes zero and the gain L becomes 1. In case of a difference between $G_X$ and $G_Y$, L is either increased or decreased so that the difference $G_X - G_Y$ is reduced again. Preferably, W assumes values between −0.3 and +0.3 so that L assumes values between 0.7 and 1.3.

Figure 9:
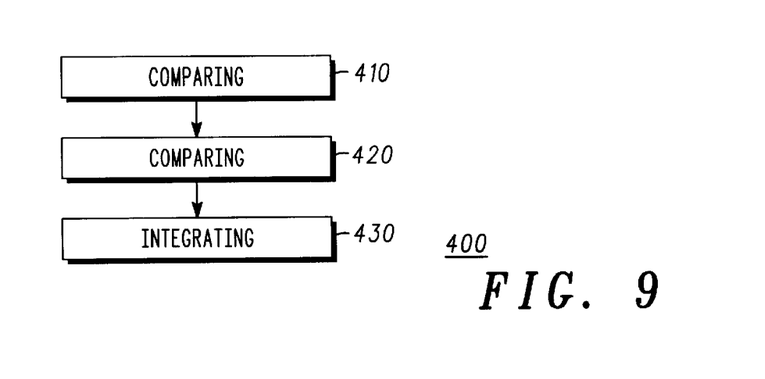
FIG. 9 illustrates a simplified flow chart diagram of a method according to the present invention.

FIG. 9 illustrates a simplified flow chart diagram of method 400 for controlling the gain balance in circuit 299 between first channel 291 that forwards a first two-component input signal (e.g., $I_D(P)$, $I_D(M)$) to a first two-component output signal (e.g., $I_A(P)$, $I_A(M)$) and second channel 292 that forwards a second two-component input signal (e.g., $Q_D(P)$, $Q_D(M)$) to a second two-component output signal (e.g., $Q_A(P)$, $Q_A(M)$). Method 400 comprising the following steps: independently comparing 410 and 420 and integrating 430. Although illustrated in consecutive order, steps 410 and 420 are preferably performed simultaneously.

In comparing step 410, all of four component combinations (e.g., $I_D(P),Q_D(P)$; $I_D(P),Q_D(M)$; $I_D(M),Q_D(P)$; $I_D(M),Q_D(M)$) of the first and second input signals are independently (cf. separate comparators 221–224) compared to each other at sampling rate F. The result is represented by four single-bit input related signals (e.g., $Q_D(P,P)$; $Q_D(P,M)$; $Q_D(M,P)$; $Q_D(M,M)$).

In comparing step 420, all of four component combinations $((I_A(P),Q_A(P); I_A(P),Q_A(M); I_A(M),Q_A(P); I_A(M),Q_A(M)))$ of the first and second output signals are independently compared (cf. comparators 211–214) to each other also at sampling rate F. The result is represented by single-bit output related signals $((Q_A(P,P); Q_A(P,M); Q_A(M,P); Q_A(M,M))$.

In integrating step 430, a predetermined combination (cf. summation patterns, equations (28) to (56)) of the single-bit input and output related signals obtains control signal W at a second, lower sampling rate $F_R$. Signal W adjusts the gain L in either channel 291 (cf. FIG. 2) or in channel 292.

When, as mentioned above, the function of processing circuit 290 is implemented by a DSP or other processor, the method steps comprise software routines for the processor. Persons of skill in the art are able to write such routines.

Gain controller 200 can be operated either when circuit 299 is operating with signals $(I_D, Q_D, I_A, Q_A)$ that actually carry information, or when circuit 299 receives reference signals $(I_D, Q_D)$ that are substantially equal in amplitude. Preferably, gain controller 200 is implemented together with circuit 299 on a single monolithic chip.

Having described the present invention in detail, the present invention can also be summarized as follows: Gain controller 200 for correcting a gain imbalance in radio circuit 299 that forwards a signal pair I,Q by first channel 291 and second channel 292 monitors differences between the overall gains $G_I$, $G_Q$ in channels 191, 292 and feeds back gain determining control signal W to one of the channels (e.g., to channel 292). First and second pluralities of single-bit comparators 221–224, 211–214 monitor the signal pair at channel inputs 281, 282 and at channel outputs 283, 284, respectively, at first sampling rate F and provide difference signals $\Delta X, \Delta Y$. Integrator 280 receives the difference signals and calculates the gain control signal W in second, decimated sampling rate $F_R$.

While the invention has been described in terms of particular structures, devices and methods, those of skill in the art will understand based on the description herein that it is not limited merely to such examples and that the full scope of the invention is properly determined by the claims that follow.

Glossary of Terms

In the following, abbreviations, physical units, and writing conventions are listed alphabetically. This glossary is provided only for convenience.

| | |
|---|---|
| A | analog |
| $C_D(\ldots,\ldots)$ | output signal of digital comparator |
| $C_A(\ldots,\ldots)$ | output signal of analog comparator |
| $(\ldots,\ldots)$ | (P, P) (P, M) (M, P) or (M, M) origin of I and Q signal components, respectively, supplied to comparator inputs |
| D | digital |
| F | first sampling rate |
| $F_R$ | second, lower sampling rate |
| $G_I, G_Q$ | overall gains |
| $G_x$ | gain |
| $G_y$ | gain |
| $I_A, I_A(P), I_A(M)$ | analog in-phase signal with P and M components |
| $I_D, I_D(P), I_D(M)$ | digital in-phase signal with P and M components |
| I° | conditioned in-phase signal |
| L | gain |
| j | index (cf. (1)) |
| h | constant |
| k | scaling factor |
| $O(\ldots,\ldots)$ | comparator offset |
| P | plus |
| $Q_A, Q_A(P), Q_A(M)$ | analog quadrature signal with P and M components |
| $Q_D, Q_D(P), Q_D(M)$ | digital quadrature signal with P and M components |
| $Q_{D\ MOD}$ | modified signal |
| Q° | conditioned quadrature signal |
| M | minus |
| N | delay duration by number of time slots T |
| R | sampling rate decimation ratio, number of time slots in time frame |
| r | index |
| SAMPLE | sample signal |
| t | time |
| t1, t2, … | time points |
| T | time slot |
| $T_R$ | time frame |
| $T_{SIG}$ | signal period length |
| $V_D$ | digital signal at F |
| V° | digital signal at lower sampling rate $F_R$ |
| $V_{AVERAGE}$ | average |
| W | gain control signal |
| $X_A, X_D$ | combination signals provided by combiner |
| $x_A, x_D, y_A, y_D$ | noise introduced by combiner |
| $\Delta X, \Delta X°$ | difference signal |
| $Y_A, Y_D$ | combination signal provided by combiner |
| y | noise introduced by combiner |
| $\Delta Y, \Delta Y°$ | difference signal |
| $Z^{-N}$ | delay by N time slots T |
| MHz | Megahertz |
| * | multiplication |
| / and — | division |
| $\Sigma$ | sum of multiple summands |
| $\int$ | integral |

What is claimed is:

1. Gain controller for a circuit having a first channel to forward an first input signal to a first output signal and a second channel to forward a second input signal to a second output signal, said gain controller providing a control signal that adjusts the gain in either said first channel or said second channel, said gain controller comprising:

a first plurality of comparators, each comparator to compare one of first and second components of said first input signal to one of first and second components of said second input signal, each comparator to provide a single-bit input related signal at a first sampling rate;

a second plurality of comparators, each comparator to compare one of first and second components of said first output signal to one of first and second components of said second output signal, each comparator to provide a single-bit output related signal at said first sampling rate; and a signal processing circuit to receive said single-bit input related signal from each of said comparators of said first plurality, to receive said single-bit output related signal from each of said comparators of said second plurality, to integrate a predetermined combination of said single-bit signals to said control signal at a second, lower sampling rate.

2. The gain controller according to claim 1, wherein said signal processing circuit further receives said first input signal and said second input signal.

3. The gain controller according to claim 1, wherein said signal processing circuit uses decimators for rate converting.

4. The gain controller according to claim 3, wherein said decimators convert from said first sampling rate to said second sampling rate in a decimation ratio in the range between 8 and 64.

5. The gain controller according to claim 1, wherein said first input signal and said second input signal are digital signals.

6. The gain controller according to claim 1, wherein said first output signal and said second output signal are analog signals.

7. The gain controller according to claim 1, for a circuit where said first channel is an in-phase channel and said second channel is a quadrature channel, in said gain controller, said first input signal being an in-phase input signal, said first output signal being an in-phase output signal, said second input signal being a quadrature input signal, and said second output signal being a quadrature output signal.

8. The gain controller according to claim 7, wherein in said first plurality of comparators, a first comparator receives the first component of the in-phase input signal and the first component of the quadrature input signal and provides a first single-bit input related signal;

a second comparator receives the first component of the in-phase input signal and the second component of the quadrature input signal and provides a second single-bit input related signal;

a third comparator receives the second component of the in-phase input signal and the first component of the quadrature input signal and provides a third single-bit input related signal; and a fourth comparator receives the second component of the in-phase input signal and the second component of the quadrature input signal and provides a fourth single-bit input related signal.

9. The gain controller according to claim 8, wherein in said signal processing circuit, a first combiner provides a first combination signal by combining said first single-bit input related signal, said second single-bit input related signal, said third single-bit input related signal, and said fourth single-bit input related signal according to a first summation pattern; and a second combiner provides a second combination signal by combining said first single-bit input related signal, said second single-bit input related signal, said third single-bit input related signal, and said fourth single-bit input related signal according to a second summation pattern.

10. The gain controller according to claim 9, wherein in said second plurality of comparators, a first comparator receives the first component of the in-phase output signal and the first component of the quadrature output signal and provides a first single-bit output related signal;

a second comparator receives the first component of the in-phase output signal and the second component of the quadrature output signal and provides a second single-bit output related signal;

a third comparator receives the second component of the in-phase output signal and the first component of the quadrature output signal and provides a third single-bit output related signal; and a fourth comparator receives the second component of the in-phase output signal and the second component of the quadrature output signal and provides a fourth single-bit output related signal.

11. The gain controller according to claim 10 wherein in said signal processing circuit, a third combiner provides a third combination signal by combining said first single-bit output related signal, said second single-bit output related signal, said third single-bit output related signal, and said fourth single-bit output related signal signal according to said first summation pattern;

a fourth combiner provides a fourth combination signal by combining said first single-bit output related signal, said second single-bit output related signal, said third single-bit output related signal, and said fourth single-bit output related signal signal according to said second summation pattern.

12. The gain controller according to claim 10 wherein in said signal processing circuit, a first representation of the difference between said third combination signal and said first combination signal is multiplied with a representation of said in-phase input signal to a first intermediate product, a second representation of the difference between said fourth combination signal and said second combination signal is multiplied with a representation of said quadrature input signal to a second intermediate product, and the difference between said first and second intermediate products is integrated to said control signal.

13. The gain controller according to claim 12 wherein in said signal processing circuit, said first and second representations are digital signals at said second sampling rate.

14. The gain controller according to claim 11, wherein said first summation pattern means that said first and third combiners provide said first and third combination signals, respectively, by combining the positive of said first single-bit signal, the positive of said second single-bit signal, the negative of said third single-bit signal, and the negative of said fourth single-bit signal signal.

15. The gain controller according to claim 11, wherein said second summation pattern means that said second and fourth combiners provide said second and fourth combination signals, respectively, by combining the positive of said first single-bit signal, the negative of said second single-bit signal, the positive of said third single-bit signal, and the negative of said fourth single-bit signal.

16. Gain controller according to claim 1 wherein said signal processing circuit is implemented by a general purpose processor.

17. Gain controller according to claim 14 wherein said signal processing circuit is implemented by a digital signal processor.

18. Method for controlling the gain balance in a circuit between a first channel that forwards a first two-component input signal to a first two-component output signal and a second channel that forwards a second two-component input signal to a second two-component output signal, said method comprising the following steps:

independently comparing all of four component combinations of said first and second input signals and representing the comparison results by four single-bit input related signals at a first sampling rate;

independently comparing all of four component combinations of said first and second output signals and representing the comparison results by four single-bit output related at said first sampling rate; and integrating a predetermined combination of said single-bit input and output related signals to obtain a control signal at a second, lower sampling rate that adjusts the gain in either said first channel or in said second channel.

19. A gain controller for correcting a gain imbalance in a radio circuit that forwards a signal pair by first and second channels, said gain controller monitoring differences between the overall gains in the channels and feeding back a gain determining control signal to one of the channels, said gain controller characterized in that first and second pluralities of single-bit comparators monitor the signal pair at the channel inputs and at the channel outputs, respectively, at a first sampling rate and provide difference signals, and an integrator receiving the difference signals calculates the gain control signal in a second, decimated sampling rate.

* * * * *